US008675703B2

(12) United States Patent
Walter et al.

(10) Patent No.: US 8,675,703 B2
(45) Date of Patent: Mar. 18, 2014

(54) TWO TERMINAL LIGHT EMITTING AND LASING DEVICES AND METHODS (75) Inventors: Gabriel Walter, Champaign, IL (US); Milton Feng, Champaign, IL (US); Nick Holonyak, Jr., Urbana, IL (US)

(73) Assignees: Quantum Electro Opto Systems Sdn. Rhd., Melaka (MY); The Board of Trustees of The University of Illinois, Urbana, IL (US)

( * ) Notice: Subject to any disclaimer, the term of this patent is extended or adjusted under 35 U.S.C. 154(b) by 221 days.

(21) Appl. No.: 12/655,806

(22) Filed: Jan. 7, 2010

(65) Prior Publication Data
US 2010/0202483 A1 Aug. 12, 2010

Related U.S. Application Data (60) Provisional application No. 61/204,560, filed on Jan. 8, 2009, provisional application No. 61/204,602, filed on Jan. 8, 2009, provisional application No. 61/208,422, filed on Feb. 24, 2009.

(51) Int. Cl.
*H01S 5/00* (2006.01)

(52) U.S. Cl.
USPC ............................................. 372/46.01

(58) Field of Classification Search
USPC ............................................. 372/46.01
See application file for complete search history.

(56) References Cited

U.S. PATENT DOCUMENTS

| 3,898,583 | A  | * | 8/1975  | Shuey ................... 372/29.021 |
| 7,091,082 | B2 |   | 8/2006  | Feng et al. ................. 438/235 |
| 7,286,583 | B2 |   | 10/2007 | Feng et al. ...................... 372/30 |
| 7,354,780 | B2 |   | 4/2008  | Feng et al. ..................... 257/292 |
| 7,535,034 | B2 |   | 5/2009  | Walter et al. ..................... 372/43 |
| 7,711,015 | B2 |   | 5/2010  | Holonyak et al. ................ 372/11 |
| 7,813,396 | B2 |   | 10/2010 | Feng et al. ................. 372/43.01 |
| 8,179,937 | B2 | * | 5/2012  | Walter et al. ............... 372/38.05 |
| 8,509,274 | B2 | * | 8/2013  | Walter et al. ............... 372/38.05 |
| 2001/0050934 | A1 | | 12/2001 | Choquette et al. .............. 372/43 |
| 2005/0040432 | A1 | | 2/2005  | Feng et al. ..................... 257/198 |
| 2005/0054172 | A1 | | 3/2005  | Feng et al. ..................... 438/313 |

(Continued)

FOREIGN PATENT DOCUMENTS

JP 61270885 12/1986

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

(Continued)

*Primary Examiner* — Jessica Stultz
*Assistant Examiner* — Delma R Forde
(74) *Attorney, Agent, or Firm* — Martin Novack (57) ABSTRACT

A method for producing light emission from a semiconductor structure, including the following steps: providing a semiconductor structure that includes a first semiconductor junction between an emitter region of a first conductivity type and a base region of a second conductivity type opposite to that of the first conductivity type, and a second semiconductor junction between the base region and a drain region; providing, within the base region, a region exhibiting quantum size effects; providing an emitter electrode coupled with the emitter region; providing a base/drain electrode coupled with the base region and the drain region; and applying signals with respect to the emitter and base/drain electrodes to obtain light emission from the semiconductor structure.

33 Claims, 6 Drawing Sheets

(56) References Cited

U.S. PATENT DOCUMENTS

| | | |
|---|---|---|
| 2006/0093010 A1 | 5/2006 | Sekiya et al. ............... 372/99 |
| 2008/0089368 A1 | 4/2008 | Feng et al. ............... 372/25 |
| 2008/0205461 A1 | 8/2008 | Henrichs ............... 372/29.023 |
| 2008/0240173 A1 | 10/2008 | Holonyak et al. ............... 372/9 |
| 2009/0134939 A1 | 5/2009 | Feng et al. ............... 327/581 |
| 2010/0034228 A1 | 2/2010 | Holonyak et al. ............... 374/45 |
| 2010/0103971 A1 | 4/2010 | Then et al. ............... 372/45.01 |
| 2012/0249009 A1* | 10/2012 | Walter et al. ............... 315/246 |

OTHER PUBLICATIONS

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation Of A Heterojunction Bipolar Light-Emitting Transistor, G. Walter, N. Holonyak, Jr., M. Feng, and R. Chan, Appl. Phys. Lett. 85, 4768 (2004).

Microwave Operation And Modulation Of A Transistor Laser, R. Chan, M. Feng, N. Holonyak, Jr., and G. Walter, Appl. Phys. Lett. 86, 131114 (2005).

Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing In A Multiple Input Transistor Laser Near Threshold, M. Feng, N. Holonyak, Jr., R. Chan, A. James, and G. Walter, Appl. Phys. Lett. 88, 063509 (2006).

Collector Current Map Of Gain And Stimulated Recombination On The Base Quantum Well Transitions Of A Transistor Laser, R. Chan, N. Holonyak, Jr., A. James, G. Walter, Appl. Phys. Lett. 88, 143508 (2006).

Collector Breakdown In The Heterojunction Bipolar Transistor laser, G. Walter, A. James, N. Holonyak, Jr., M. Feng, and R. Chan, Appl. Physics Lett. 88, 232105 (2006).

High-Speed (≥1 GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime And Modulation Bandwidth of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp In A Transistor Laser: Franz-Keldysh Reduction of The Linewidth Enhancement, G. Walter, A. James, N. Holonyak, Jr., and M. Feng, App. Phys. Lett. 90, 091109 (2007).

Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007).

Experimental Determination Of The Effective Minority Carrier Lifetime In The Operation Of A Quantum-Well n-p-n Heterojunction Bipolar Light-Emitting Transistor Of Varying Base Quantum-Well Design And Doping; H.W. Then, M. Feng, N. Holonyak, Jr., and C. H. Wu, Appl. Phys. Lett. 91, 033505 (2007).

Charge Control Analysis Of Transistor Laser Operation, M. Feng, N. Holonyak, Jr., H. W. Then, and G. Walter, Appl. Phys. Lett. 91, 053501 (2007).

Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007).

Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 µm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement Of Heterojunction Bipolar Transistor Laser Operation With An Auxiliary Base Signal, H.W. Then, G. Walter, M. Feng, and N. Holonyak, Jr., Appl. Phys. Lett. 93, 163504 (2008).

Bandwidth Extension By Trade-Off Of Electrical And Optical Gain In A Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

* cited by examiner

TWO TERMINAL LIGHT EMITTING AND LASING DEVICES AND METHODS

PRIORITY CLAIMS

Priority is claimed from U.S. Provisional Patent Application Ser. No. 61/204,560, filed Jan. 8, 2009, and from U.S. Provisional Patent Application Ser. No. 61/204,602, filed Jan. 8, 2009, and from U.S. Provisional Patent Application Ser. No. 61/208,422, filed Feb. 24, 2009, and all of said U.S. Provisional Patent Applications are incorporated herein by reference.

RELATED APPLICATION

The subject matter of this Application relates to subject matter disclosed in copending U.S. patent application Ser. No. 12/655.807, filed of even date herewith and assigned to the same assignees as the present Application.

FIELD OF THE INVENTION

This invention relates to methods and devices for producing light emission and laser emission in response to electrical signals. The invention also relates to methods and devices for producing light emission and laser emission from two terminal semiconductor devices.

BACKGROUND OF THE INVENTION

A part of the background hereof lies in the development of wide bandgap semiconductors to achieve high minority carrier injection efficiency in a device known as a heterojunction bipolar transistor (HBT). These transistor devices are capable of operation at extremely high speeds. For example, InP HBTs have, in recent years, been demonstrated to exhibit operation at speeds above 500 GHz.

Another part of the background hereof lies in the development of heterojunction bipolar transistors which operate as light-emitting transistors and laser transistors. Reference can be made, for example, to U.S. Pat. Nos. 7,091,082, 7,286,583, 7,354,780, and 7,535,034; U.S. Patent Application Publication Numbers US2005/0040432, US2005/0054172, US2008/0240173, and US2009/0134939; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain (β>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); and Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008).

Due to the increasing demand for transfer and storage for high definition digital video data, high speed communication links are starting to traverse the consumer electronic market at link speeds once demanded almost exclusively only in the commercial market, via standards such as HDMI 1.3 and 1.4, USB 3.0, Displayport 2.0 and PCI2.0. However, the increasing higher data speed, now approaching ~6.8 Gbps/channel for the new HDMI 1.4 standard, adds design, technical and manufacturing complexity on the traditional transmission media via copper wire. The results are consumer products that are increasingly bulkier, unaesthetic and inflexible.

Fiber based communication links have long since started to replace copper media links, but mainly at non-consumer market distances of larger than 30 meters. At distances of less than 5 meters, where the bulk of the consumer market is, VCSEL (vertical cavity surface emitting lasers) based optical solutions are unable to compete based on price and even power consumption.

The study of the transistor base transport mechanism led to the emergence of a new class of high speed (>1 GHz) tilted charge spontaneous light emitters as the quantum well light emitting transistor (QW-LET) and the transistor laser (TL) that are promisingly much cheaper to manufacture or operate than traditional diode laser devices (see e.g. the above-listed Patent documents and publications). Unfortunately, widely available low cost high speed driver ICs and biasing circuitry, and opto-manufacturing facilities are built upon two terminal devices such as LEDs and laser diodes. Therefore, the transition from a two terminal devices to three terminal devices requires supporting industry (e.g. IC designers, and manufacturing facilities) to also transition, which then delays and increases the cost of implementing the QW-LET and TL.

It is among the objectives of the present invention to devise a two terminal semiconductor light emitter or laser that has advantages over existing semiconductor light emitter and lasers, including simplicity of design, ease of fabrication, and the capability of efficient high speed light generation, and which also has certain attributes of three terminal light emitting transistors or transistor lasers, but which is compatible with applications that favor or require two terminal operation.

SUMMARY OF THE INVENTION

Figure 1A:
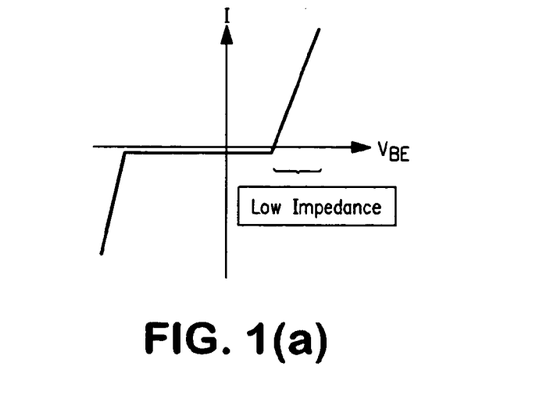
FIG. 1a shows a simplified transistor I vs. $V_{BE}$ plot.
Figure 1B:
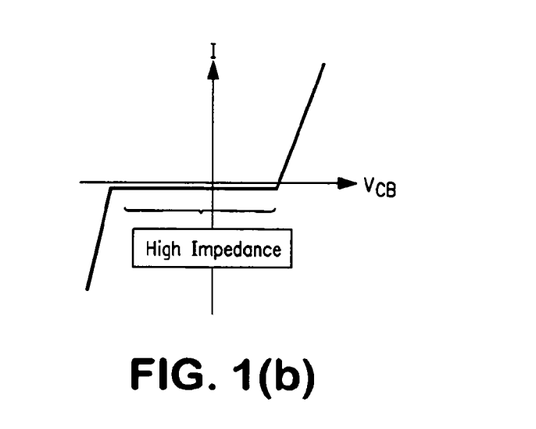
FIG. 1b shows a simplified transistor I vs. $V_{CB}$ plot.
Figure 2:
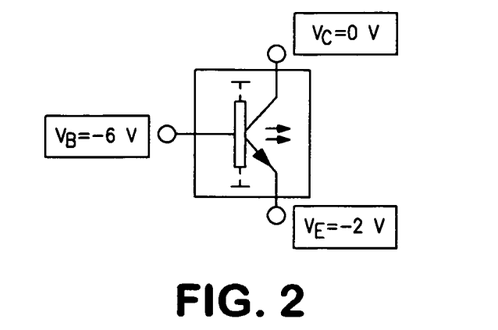
FIG. 2 shows an example of a transistor in common collector configuration.

A transistor is a device having of two semiconductor junctions; the Base-Emitter (BE) Junction and the Collector-Base (CB) Junction. To operate as a transistor, the BE junction is required to be at low impedance (forward bias (see FIG. 1$a$), typically $V_{BE}$>1.2 V), while the Collector-Base junction is required to be at high impedance ((See FIG. 1$b$), typically 0.8>$V_{CB}$>−5 V). Under common collector configuration, a collector is generally grounded (0 V) and $V_E$ and $V_B$ are selected so that transistor bias is maintained ($V_{BE}$>1.2 V, and 0.8>$V_{CB}$>−5 V), as shown in FIG. 2.

Figure 3A:
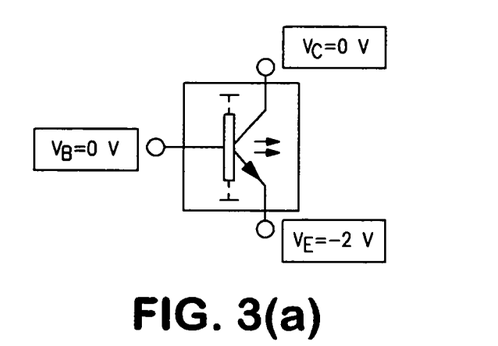
FIG. 3a shows a transistor in common collector configuration, in a special biasing condition that still maintains transistor operation.
Figure 3B:
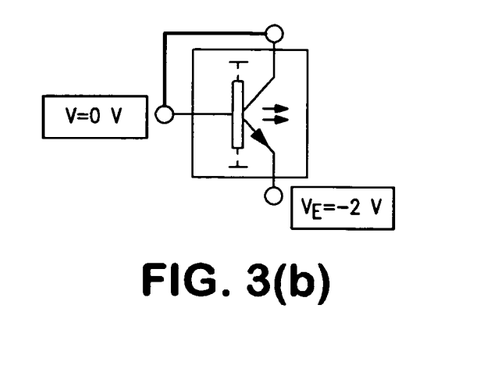
FIG. 3b shows a transistor configuration with base and collector terminals electrically connected, while maintaining transistor operation.

Applicant has noted, however, that there exists a special condition where $V_B$=$V_C$=0 (hence $V_{CB}$=0 V, see FIG. 3$a$), and therefore also fulfilling the transistor requirement that 0.8>$V_{CB}$>−5 V for high impedance operation in a typical high speed HBT (e.g. InGaP/GaAs HBT). This condition also implies that the base and collector terminals can be electrically connected (on the device through fabrication or externally) while still maintaining transistor operation (see FIG. 3$b$).

A transistor laser is a three terminal and two port electrical device, where a first electrical input has low impedance, and current (known as collector current) is drawn from the high impedance second electrical output. The device also has an optical output port. [Reference can be made to the Patent documents and publication documents referenced in the Background portion hereof.] In a conventional transistor, this transfer of electrical impedance (or resistance) from low-to-high, was the genesis of its name; that is, the "transfer resistor" device or "transistor". A measurable collector current is critical to the operation of a transistor. However, a main factor that supports fast operation of the transistor laser (in an NPN transistor laser, for example) is the mechanism that helps eliminate injected electrons that did not recombine in the highly doped base region of the transistor—and this is achieved by the use of a high impedance collector design.

However, having two electrical ports can complicate fabrication, affecting both yield and cost. Also, for certain applications it is necessary or desirable to have only one electrical input port and an optical output.

It is possible that the intrinsic fast operation of the light emitting transistor or transistor laser can still be maintained in a two terminal device (i.e., single electrical input port device) by replacing the collector junction with a drain. The drain serves the same purpose of allowing excess electrons to exit the N-P (Emitter-Base) junction of the device. However, it eliminates the functionality of this excess current (since it is no longer excess current to be collected but rather eliminated) by draining the electrons towards non-radiative recombination at the common contact. The drain is required to operate at high impedance mode, which can be achieved by having a common bias with the P-terminal of the base.

In accordance with a form of the invention, a method is set forth for producing light emission from a semiconductor structure, including the following steps: providing a semiconductor structure that includes a first semiconductor junction between an emitter region of a first conductivity type and a base region of a second conductivity type opposite to that of said first conductivity type, and a second semiconductor junction between said base region and a drain region; providing, within the base region, a region exhibiting quantum size effects; providing an emitter electrode coupled with the emitter region; providing a base/drain electrode coupled with the base region and the drain region; and applying signals with respect to the emitter and base/drain electrodes to obtain light emission from said semiconductor structure.

In a preferred embodiment of this form of the invention, the step of providing the second semiconductor junction between the base region and the drain region includes providing the drain region as a drain layer adjacent the base region and a sub-drain layer adjacent the drain layer, and wherein said step of providing a base/drain electrode coupled with the base region and the drain region comprises providing a base/drain electrode coupled with the base region and the sub-drain layer. In this embodiment, the step of providing a semiconductor structure comprises providing planar semiconductor layers, and the step of providing a base/drain electrode comprises providing a conductive base/drain contact that contacts the periphery of the base region, and contacts the sub-drain layer. Also in this embodiment, the step of providing a first semiconductor junction between the emitter region of the first conductivity type and the base region of a second conductivity type comprises providing the first semiconductor junction as a heterojunction. The second semiconductor junction can be provided as a homojunction or a heterojunction.

In accordance with another form of the invention, a semiconductor device is set forth for producing light emission, comprising: a semiconductor structure that includes a first semiconductor junction between an emitter region of a first conductivity type and a base region of a second conductivity type opposite to that of said first conductivity type, and a second semiconductor junction between the base region and a drain region; a quantum size region within the base region; an emitter electrode coupled with the emitter region; and a base/drain electrode coupled with the base region and the drain region; whereby signals applied with respect to said emitter and base/drain electrodes produce light emission from the base of the semiconductor device.

The two-terminal devices of the present invention retain the fast transistor base transport mechanism of LETs and TLs while allowing the device to be compatible with existing diode circuitries and manufacturing facilities As a two terminal device it will also tend to be cheaper to manufacture and package than the three terminal devices. For example, it requires fewer lithography steps, fewer bonding pads, and less fabrication time, and will provide a higher yield.

Further features and advantages of the invention will become more readily apparent from the following detailed description when taken in conjunction with the accompanying drawings.

DETAILED DESCRIPTION

Applicant has determined that the intrinsic fast operation of the light emitting transistor or transistor laser can still be maintained in a two terminal device (single electrical input port device) by replacing the collector junction with a drain. The drain serves the same purpose of allowing excess electrons to exit the N-P (Emitter-Base) junction of the device. However, it eliminates the functionality of this excess current (since it is no longer excess current to be collected but rather eliminated) by draining the electrons towards non-radiative recombination at the common contact. The drain is required to operate at high impedance mode, which can be achieved by having a common bias with the P-terminal of the base.

Figure 4:
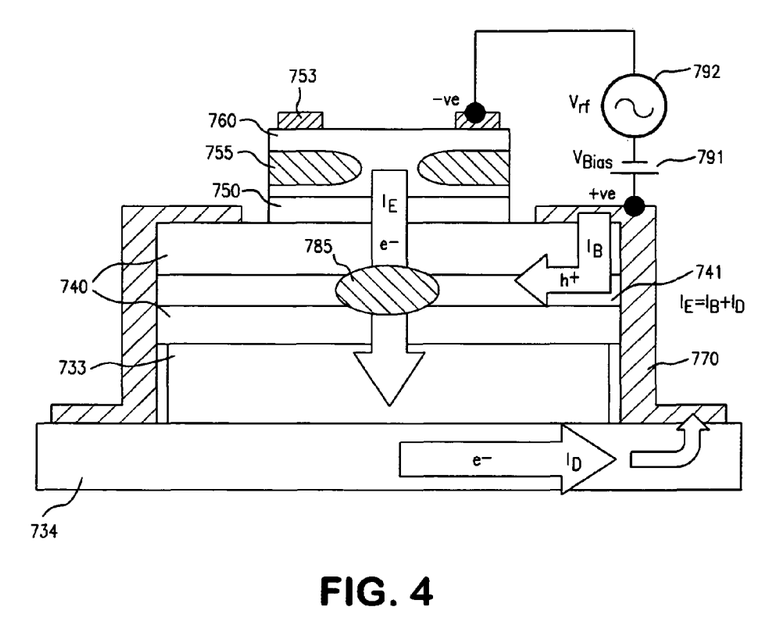
FIG. 4 shows a cross-sectional view of a two junction light emitting diode in accordance with an embodiment of the invention, and which can be used in practicing an embodiment of the method of the invention.

Referring to FIG. 4, there as shown a device in accordance with an embodiment of the invention and which can be used in practicing an embodiment of the method of the invention. The device can be fabricated using, for example, conventional semiconductor deposition techniques for depositing III-V semiconductor layers and device fabricating and finishing techniques as described, for example, in the patents and publications listed in the Background portion hereof, and in the referenced copending U.S. application filed of even date herewith. In this embodiment, a p-type base region 740 is disposed between unintentionally doped n-type drain region 733 and n-type emitter region 750, so that there is a first semiconductor junction between said emitter and base region and second semiconductor junction between the base region and the drain region. The base region 740 includes quantum size region 741, such as, for example, one or more quantum wells or one or more regions of the quantum dots. Below the drain 733 is n-type sub-drain 734. Above the emitter is an emitter cladding and contact region 760 and oxide-defined aperture 755. The emitter region has emitter electrode coupled thereto, in the form of emitter contact 753. A base/drain electrode is coupled with the base and drain regions. In the embodiment of FIG. 4, the base/drain electrode is a metallic contact 770 that is deposited on the periphery of the base region and sub-drain region. As shown in FIG. 4, a positive bias voltage 791 is applied to the base/drain contact 770 with respect to the emitter contact 753, and an AC voltage 792 is also applied with respect to these contacts.

The flow of electrons and holes in the FIG. 4 device is shown by the arrows in the Figure. Recombination in the base region, aided by the quantum well, results in light emission. Waveguide and cavity configurations can be added to this structure in order to allow this device to function as a two junction laser diode, two junction resonance cavity light emitting diode, or two junction vertical cavity transistor laser. (For example, typical upper and lower distributed Bragg reflectors (DBRs) can be provided in the FIG. 4 device to obtain an optical resonant cavity.) Radiative recombination is optimized in the active optical region, as represented in FIG. 4 at 785.

Figure 5:
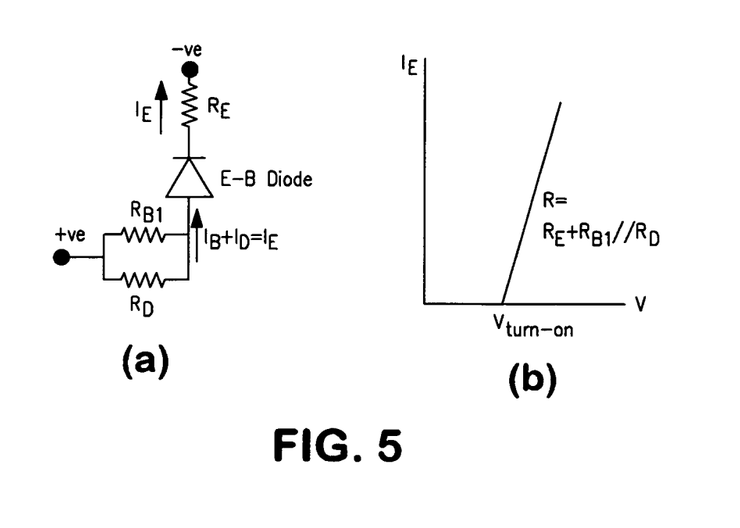
FIG. 5 shows, on the left in (a), an equivalent DC circuit of a two junction diode, and, on the right in (b), the $I_E$ vs. V characteristic. The second junction functions to reduce the overall resistance of the circuit by allowing the base layer to mainly conduct holes, and electrons are conducted by the N-type drain.
Figure 6:
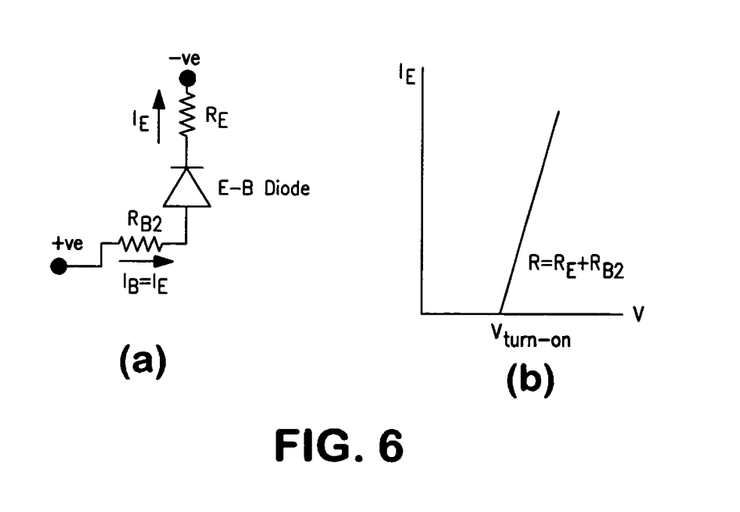
FIG. 6 shows, on the left in (a), an equivalent circuit of a single junction diode as in the prior art, and, on the right in (b), the $I_E$ vs. V characteristic. The base layer is responsible for both the flow of holes and minority electrons.

The device, of FIG. 4 can be described as a diode, as it possesses DC-electrical characteristics of a diode. Its DC equivalent circuit is shown in FIG. 5a and its I-V electrical characteristic is shown in FIG. 5b. The second junction functions to reduce the overall resistance of the circuit by allowing the base layer to mainly conduct holes, and electrons are conducted by the N-type drain. The diode possesses a turn-on voltage as defined by the built-in field of the NP-junction, and full turn-on resistance equivalent to the $R=R_E+R_{B1}//R_D$. The equivalent circuit for a prior art single junction diode, without the drain, is shown in FIG. 6a, and the corresponding I-V characteristic is shown in FIG. 6b. The base layer is responsible for both the flow of holes and minority electrons. The electrical characteristics maintain a similar turn-on voltage. However, the full turn-on resistance for the single junction diode is larger and is represented by $R=R_E+R_{B2}$. Note that $R_{B2} \neq R_{B1}$ as the heavily doped P-type base layer now has to laterally diffuse electrons and conduct holes. In the absence of the drain layer, excess electrons (minority carriers) in the prior art single junction diode are removed via recombination away from the active optical cavity region in the base as it travels laterally through the base layer, forcing a larger hole current to conduct through the resistive base layer in order to compensate recombination. Since the recombination is away from the active optical cavity, hole base current in the prior art device is not optimally used for the generation of useful radiative recombination. Electrons that did not recombine in the base could eventually diffuse to the positive contacts terminals and recombine. Since electrons are allowed to travel laterally, this increases the area where electrons are distributed and also the total amount of electron charge in the P-type base region. This leads to a relatively larger charge storage capacitance in the prior art device, with resultant slower speed.

In the two junction diode hereof, the base layer is mainly responsible for the lateral conduction of holes only. The electron path-of-least-resistance is to quickly diffuse through the relatively thin base (e.g. 130 nm) to the drain layer. This allows recombination to be optimally confined in the active optical region and therefore, the optimal use of laterally conducted holes. Since electrons are quickly diffused out of the base layer, this also leads to smaller charge storage capacitance. The combined smaller capacitance and resistance is highly beneficial for high speed operation due to relationship between device speed and the RC time constant product.

In an exemplary embodiment hereof, employing a homojunction as the second junction, the emitter region is n-type InGaP, the base region is heavily doped p-type GaAs with an undoped InGaAs quantum well, the drain layer is lightly doped n-type GaAs, and the sub-drain layer is n-type GaAs. In an embodiment with a heterojunction as the second junction, the base can be, for example, AlGaAs, with a GaAs quantum well. Also, while an npn embodiment is shown, a pnp embodiment can also be implemented.

Figure 7:
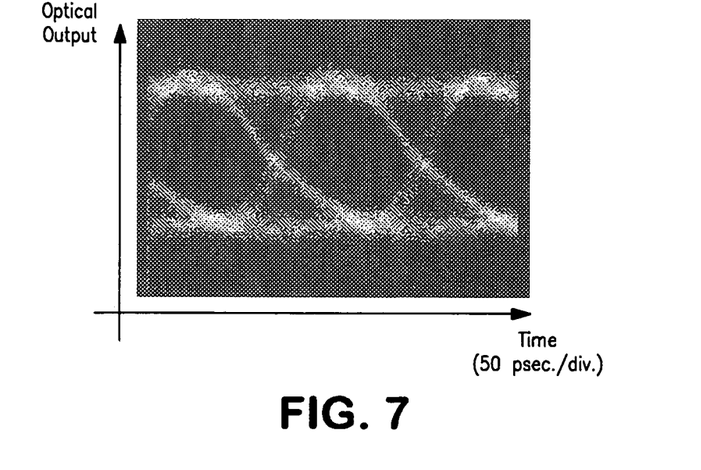
FIG. 7 shows an oscillograph display of optical output (optical detector voltage) as a function of time for an embodiment hereof. The display shows a 5 Gbps eye at 15 degrees C. at an emitter current of 70 mA. The time scale is 50 picoseconds per division.
Figure 8:
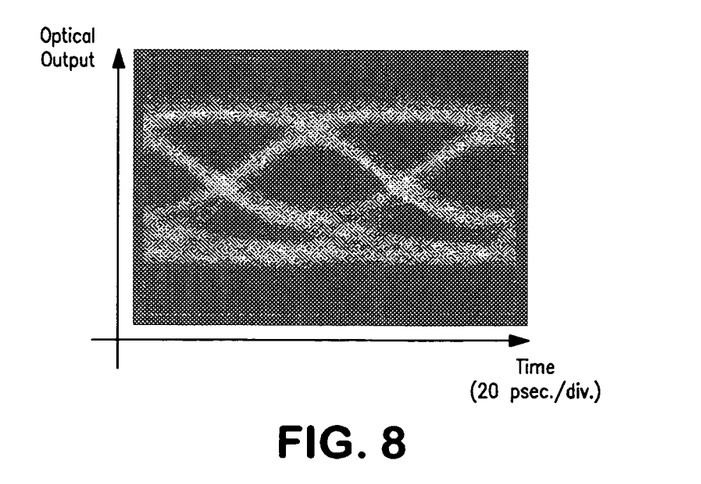
FIG. 8 shows another oscillograph display of optical output as a function of time for an embodiment hereof. The display shows a 10.3125 Gbps eye at an emitter current of 100 mA. The time scale is 20 picoseconds per division.

A 450 um cavity length two junction laser diode was fabricated and tested at 15 Celsius. It was demonstrated that the device is capable of 5 Gbits (FIG. 7) and 10 Gbits (FIG. 8) operation.

In the referenced copending application, filed of even date herewith, there is disclosed, inter alia, the advantage of employing a base region that includes a first base sub-region on the emitter side of a quantum size region, and a second base sub-region on the collector side of a quantum size region, the first and second base sub-regions having asymmetrical band structures; namely, the first base sub-region comprises a relatively higher bandgap semiconductor material and the second base sub-region comprises a relatively lower bandgap semiconductor material. By doing so, rethermalization of carriers from the quantum size region toward the emitter region is reduced. Thus, for example, in the embodiment of FIG. 4, base sub-regions on opposing sides of quantum well 741 can be in accordance with those teachings.

Figure 9:
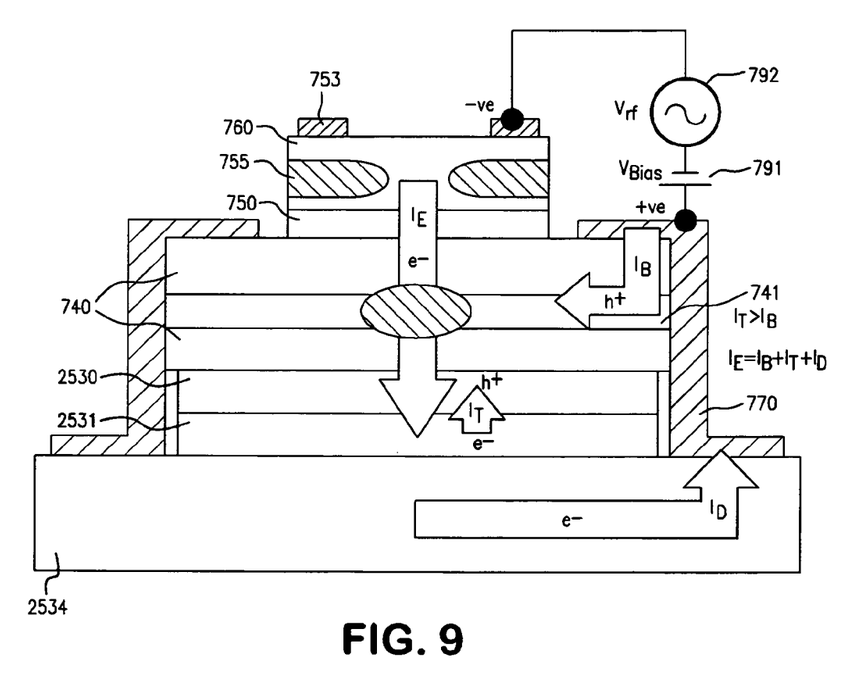
FIG. 9 shows a cross-sectional view of another embodiment hereof.

FIG. 9 shows another embodiment hereof which utilizes a tunnel junction as the drain layer. Reference can be made, for example, to Tunnel Junction Transistor Laser, M. Feng, N. Holonyak, Jr., H. W. Then, C. H. Wu, and G. Walter, Appl. Phys. Lett. 94, 04118 (2009). In FIG. 9, the p+ layer 2530 of the tunnel junction is adjacent the base 740 and the n+ layer 2531 of the tunnel junction is adjacent an n-type contact layer 2534.

The invention claimed is:

1. A method for producing light emission from a semiconductor structure, comprising the steps of:
providing a semiconductor structure that includes a first semiconductor junction between an emitter region of a first conductivity type and a base region of a second conductivity type opposite to that of said first conductivity type, and a second semiconductor junction between said base region and a drain region;
providing, within said base region, a region exhibiting quantum size effects;
providing an emitter electrode coupled with said emitter region;
providing a base/drain electrode in direct contact with said base region and coupled with said drain region; and
applying signals with respect to said emitter and base/drain electrodes to obtain light emission from said semiconductor structure.

2. The method as defined by claim 1, wherein said step of providing said second semiconductor junction between said base region and said drain region includes providing said drain region as a drain layer adjacent said base region and a sub-drain layer adjacent said drain layer, and wherein said step of providing said base/drain electrode further comprises providing said base/drain electrode as being in direct contact with said sub-drain layer.

3. The method as defined by claim 2, wherein said step of providing a base/drain electrode comprises providing a conductive base/drain contact that directly contacts said base region and directly contacts said sub-drain layer.

4. The method as defined by claim 2, wherein said step of providing a semiconductor structure comprises providing planar semiconductor layers, and wherein said step of providing a base/drain electrode comprises providing a conductive base/drain contact that directly contacts the periphery of said base region, and directly contacts said sub-drain layer.

5. The method as defined by claim 4, wherein said step of providing a first semiconductor junction between said emitter region of said first conductivity type and a base region of said second conductivity type includes providing said base region heavily doped p-type.

6. The method as defined by claim 4, wherein said step of providing a first semiconductor junction between said emitter region of said first conductivity type and said base region of a second conductivity type comprises providing said first semiconductor junction as a heterojunction.

7. The method as defined by claim 6, wherein said step of providing said second semiconductor junction between said base region and a drain region comprises providing said second semiconductor junction as a homojunction.

8. The method as defined by claim 6, wherein said step of providing said second semiconductor junction between said base region and a drain region comprises providing said second semiconductor junction as a heterojunction.

9. The method as defined by claim 1, wherein said step of providing a first semiconductor junction between said emitter region of said first conductivity type and said base region of a second conductivity type comprises providing said first semiconductor junction as a heterojunction.

10. The method as defined by claim 9, wherein said step of providing said second semiconductor junction between said base region and a drain region comprises providing said second semiconductor junction as a homojunction.

11. The method as defined by claim 9, wherein said step of providing said second semiconductor junction between said base region and a drain region comprises providing said second semiconductor junction as a heterojunction.

12. The method as defined by claim 1, wherein said first conductivity type is n-type and said second semiconductor type is p-type.

13. The method as defined by claim 12, wherein said step of applying signals with respect to said emitter and base/drain electrodes to obtain light emission from said semiconductor structure includes applying a positive bias voltage to said base/drain electrode with respect to said emitter electrode, and also includes applying an AC signal with respect to said electrodes.

14. The method as defined by claim 12, wherein said step of applying signals with respect to said emitter and base/drain electrodes to obtain light emission from said semiconductor structure includes applying a positive bias voltage to said base/drain electrode with respect to said emitter electrode, and also includes applying an AC signal having a frequency greater than 1 GHz with respect to said electrodes.

15. The method as defined by claim 1, wherein said first conductivity type is p-type and said second semiconductor type is n-type.

16. The method as defined by claim 1, wherein said step of providing a first semiconductor junction between said emitter region of said first conductivity type and a base region of said second conductivity type includes providing said base region heavily doped p-type.

17. The method as defined by claim 1, wherein said step of providing, within said base region, a region exhibiting quantum size effects comprises providing at least one quantum well in said base region.

18. The method as defined by claim 1, wherein said step of providing, within said base region, a region exhibiting quantum size effects comprises providing at least one layer of quantum dots in said base region.

19. The method as defined by claim 1, further comprising providing an optical cavity enclosing at least a portion of said base region.

20. The method as defined by claim 1, further comprising providing an optical resonant cavity enclosing at least a portion of said base region, and wherein said light emission is laser emission.

21. The method as defined by claim 1, wherein said step of providing an emitter electrode coupled with said emitter region includes providing an emitter contact coupled with said emitter region via emitter cladding.

22. The method as defined by claim 1, wherein said step of providing said drain layer comprises providing an unintentionally doped drain layer.

23. The method as defined by claim 1, wherein said base region includes a first base sub-region on the emitter side of said quantum size region, and a second base sub-region on the drain side of said quantum size region, and wherein said first and second base sub-regions have asymmetrical band structures.

24. The method as defined by claim 23, wherein said first base sub-region comprises a relatively higher bandgap semiconductor material and said second base sub-region comprises a relatively lower bandgap semiconductor material; whereby rethermalization of carriers from said quantum size region toward the emitter region is reduced.

25. The method as defined by claim 1, further comprising providing said drain region as a tunnel junction comprising an n+ layer and a p+ layer, with said p+ layer being adjacent said base region.

26. A semiconductor device for producing light emission, comprising:
a semiconductor structure that includes a first semiconductor junction between an emitter region of a first conductivity type and a base region of a second conductivity type opposite to that of said first conductivity type, and a second semiconductor junction between said base region and a drain region;
a quantum size region within said base region;
an emitter electrode coupled with said emitter region; and
a base/drain electrode in direct contact with said base region and coupled with said drain region;
whereby signals applied with respect to said emitter and base/drain electrodes produce light emission from the base of said semiconductor device.

27. The device as defined by claim 26, wherein said drain region includes a drain layer adjacent said base region and a sub-drain layer adjacent said drain layer, and wherein said base/drain electrode is in direct contact with said sub-drain layer.

28. The device as defined by claim 27, wherein said base/drain electrode comprises a conductive base/drain contact that directly contacts said base region and directly contacts said sub-drain layer.

29. The device as defined by claim 27, wherein said semiconductor structure comprises planar semiconductor layers, and wherein said base/drain electrode comprises a conductive base/drain contact that directly contacts the periphery of said base region and directly contacts said sub-drain layer.

30. The device as defined by claim 29, further comprising an optical resonant cavity enclosing at least a portion of said base region, and wherein said device is a semiconductor laser.

31. The device as defined by claim 29, wherein first semiconductor junction comprises a heterojunction.

32. The device as defined by claim 31, wherein said second semiconductor junction comprises a homojunction.

33. The device as defined by claim 31, wherein said second semiconductor junction comprises a heterojunction.

* * * * *